United States Patent
Naeimi (10) Patent No.: US 8,316,283 B2
(45) Date of Patent: Nov. 20, 2012

(54) HYBRID ERROR CORRECTION CODE (ECC) FOR A PROCESSOR

(75) Inventor: Helia Naeimi, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 454 days.

(21) Appl. No.: 12/713,623

(22) Filed: Feb. 26, 2010

(65) Prior Publication Data

US 2011/0154157 A1 Jun. 23, 2011

Related U.S. Application Data

(60) Provisional application No. 61/289,601, filed on Dec. 23, 2009.

(51) Int. Cl.
*H03M 13/00* (2006.01)
*G01R 31/28* (2006.01)
*G06F 11/00* (2006.01)

(52) U.S. Cl. .................. 714/777; 714/758; 714/738

(58) Field of Classification Search .................. 714/777, 714/746, 758, 785, 752, 738
See application file for complete search history.

(56) References Cited

U.S. PATENT DOCUMENTS

| | | | |
|---|---|---|---|
| 3,814,923 A * | 6/1974 | Wang ............................ | 708/532 |
| 5,014,276 A * | 5/1991 | Bush et al. .................... | 714/704 |
| 5,450,340 A * | 9/1995 | Nicolaidis .................... | 708/531 |
| 6,314,511 B2 | 11/2001 | Levy et al. | |
| 6,848,069 B1 * | 1/2005 | Levy et al. ..................... | 714/755 |
| 6,889,317 B2 | 5/2005 | Sami et al. | |
| 6,941,503 B1 * | 9/2005 | Homberg et al. ............. | 714/755 |
| 7,058,877 B2 | 6/2006 | Tremblay et al. | |
| 7,738,137 B2 * | 6/2010 | Graf et al. ....................... | 358/1.8 |
| 7,971,129 B2 * | 6/2011 | Watson et al. ................ | 714/784 |
| 2004/0153763 A1 | 8/2004 | Grochowski et al. | |
| 2008/0244186 A1 | 10/2008 | Bose et al. | |
| 2011/0258510 A1 * | 10/2011 | Watson et al. ................ | 714/752 |
| 2012/0079348 A1 * | 3/2012 | Naeimi ........................ | 714/763 |

OTHER PUBLICATIONS

Glenn Hinton, et al., "The Microarchitecture of the Pentium 4 Processor," 2001, pp. 1-13.
Eric S. Fetzer, et al., "The Parity Protected, Multithreaded Register Files on the 90-nm Itanium Microprocessor," Jan. 2006, pp. 246-254.
L. Spainhower and T.A. Gregg, "IBM S/390 Parallel Enterprise Server G5 Fault Tolerance: A Historical Perspective," Sep./Nov. 1999, pp. 863-873.
Dmitry Ponomarev, et al., "Isolating Short-Lived Operands for Energy Reduction," Jan. 19, 2004, pp. 697-709.
Lozano, et al., "Exploiting Short-Lived Variables in Superscalar Processors," pp. 292-302, MICRO-28, Proceedings of the 28th Annual IEEE/AMC International Symposium on Microarchitecture, 1955.

* cited by examiner

*Primary Examiner* — Phung M Chung
(74) *Attorney, Agent, or Firm* — Trop, Pruner & Hu, P.C.

(57) ABSTRACT

In one embodiment, the present invention includes a method for generating a hybrid error correction code for a data block. The hybrid code, which may be a residual arithmetic-Hamming code, includes a first residue code based on the data block and a first parity code based on the data block and a Hamming matrix. Then the generated code along with the data block can be communicated through at least a portion of a datapath of a processor. Other embodiments are described and claimed.

20 Claims, 7 Drawing Sheets

$i_1, i_2, i_3, i_4, i_5 \ldots i_{64}$  $r_0 r_1$  $p_0 p_1 p_2 p_2 p_4 p_5$

FIG. 1A $$\begin{bmatrix} i_{0,1} & i_{0,2} & i_{0,3} & i_{0,4} & i_{0,5} & \ldots & i_{0,32} \\ i_{1,1} & i_{1,2} & i_{1,3} & i_{1,4} & i_{1,5} & \ldots & i_{1,32} \end{bmatrix}$$

FIG. 1B

FIG. 1C $$\begin{bmatrix} i_1 & i_2 & i_3 & i_4 & i_5 & \ldots & i_{32} \end{bmatrix}$$

$$\begin{bmatrix} p_0 & p_1 & p_2 & p_3 & p_4 & i_5 & i_6 & i_7 & p_8 & \ldots & i_{31} & p_{32} & i_{33} & \ldots & i_{38} \end{bmatrix}$$

FIG. 1D $$\begin{bmatrix} i_{0,1} & i_{0,2} & i_{0,3} & i_{0,4} & i_{0,5} & \ldots & i_{0,32} \\ i_{1,1} & i_{1,2} & i_{1,3} & i_{1,4} & i_{1,5} & \ldots & i_{1,32} \end{bmatrix}$$

$$\begin{bmatrix} i_{0,1} & -- & i_{0,3} & -- & i_{0,5} & i_{0,6} & i_{0,7} & -- & \ldots & i_{0,31} & -- & i_{0,33} & i_{0,34} & i_{0,35} & i_{0,36} & i_{0,37} & i_{0,38} \\ i_{1,1} & -- & i_{1,3} & -- & i_{1,5} & i_{1,6} & i_{1,7} & -- & \ldots & i_{1,31} & -- & i_{1,33} & i_{1,34} & i_{1,35} & i_{1,36} & i_{1,37} & i_{1,38} \end{bmatrix}$$

FIG. 1E $$ps_5\ ps_4\ ps_3\ ps_2\ ps_1\ ps_0 = 000101$$

$$\begin{bmatrix} i_{0,1} & -- & i_{0,3} & -- & i_{0,5} & i_{0,6} & i_{0,7} & -- & \ldots & i_{0,31} & -- & i_{0,33} & i_{0,34} & i_{0,35} & i_{0,36} & i_{0,37} & i_{0,38} \\ i_{1,1} & -- & i_{1,3} & -- & i_{1,5} & i_{1,6} & i_{1,7} & -- & \ldots & i_{1,31} & -- & i_{1,33} & i_{1,34} & i_{1,35} & i_{1,36} & i_{1,37} & i_{1,38} \end{bmatrix}$$

$$rs_1\ rs_0 = \begin{matrix} 01 \\ 10 \end{matrix}$$

HYBRID ERROR CORRECTION CODE (ECC) FOR A PROCESSOR

This application claims priority to U.S. Provisional Patent Application No. 61/289,601 filed on Dec. 23, 2009 in the name of Helia Naeimi entitled A HYBRID ERROR CORRECTION CODE (ECC) TECHNIQUE FOR A PROCESSOR.

BACKGROUND

Modern processors include various structures such as computing circuitry, logic, memory structures and so forth. Data that is processed by the structures is communicated at very high speeds, and is transmitted along very intricate datapaths formed using different types of semiconductor circuits. Given the very small size of such structures, information bits of such data can be subject to random errors such as single bit errors that may occur for a variety of reasons. Accordingly, many processors include some type of error detection circuitry, and it has been proposed to include at least some amounts of error correction circuitry for certain structures of a processor.

One challenging problem regarding usage of codes for error detection/correction in the processor (including memory and datapath) is that different types of codes are used in different units of the processor. For example, error correction codes (ECC) such as a Hamming code or similar code can be used in the memory units, and error detection codes such as residual arithmetic codes can be used in a datapath unit, and various parity codes are used in many control logics. The problem with using different types of codes in different units of the system is that the data need to be encoded and decoded multiple times when flowing through the system, increasing power consumption, complexity and real estate costs. Furthermore the circuits at the boundary of two ECC domains will not have any coverage.

Therefore moving data from one part of the system to another part requires the data going through the unprotected regions. Moving data in the system also requires extra encoding and decoding. This extra decoding and encoding process at the boundary of each sub-block increases the latency and the power consumption, and also reduces the coverage (since the encoding and decoding process can introduce errors to the data as well). As a result, this patchwork solution increases the design complexity of the system, and causes a processor or system-on-a-chip (SoC) design to be more challenging.

DETAILED DESCRIPTION

In various embodiments, an end-to-end coding technique may be used that covers a complete system, and replaces multiple different coding techniques with a single code. Such code may be a form of error correction code (ECC) that can provide end-to-end coverage for many different structures of a processor, memory or other system components. While the scope of the present invention is not limited in this regard, this code can be a hybrid code of multiple coding techniques, e.g., a combination of a residual arithmetic code and a Hamming code. As used herein this code may be referred to as a residual arithmetic-Hamming code, or RAH code. RAH code is similar to both Hamming codes and residual arithmetic codes, in the code structure and functionality. Therefore all instances of both Hamming codes and residual arithmetic codes in a processor can be replaced with a single RAH code, providing for a single universal end-to-end solution. In various embodiments, this RAH code is suitable for memory system, datapath, and control logics. Therefore it provides an end-to-end universal technique, which prevents multiple encoding and decoding between these units.

In one embodiment, this code is a two dimensional block code, and may be decoded and encoded using both a Hamming matrix and a residue generator/checker. In this technique bits can be represented in a two dimensional matrix. The following discussion to explain this code is through an example to code a 64-bit information word, although embodiments generalize to any size data word, to detect and correct any number of errors.

Figure 1A:
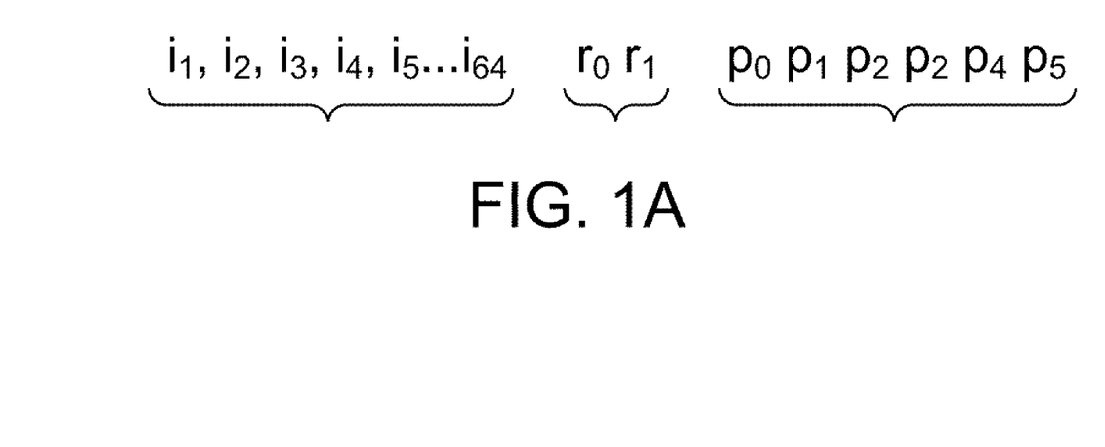
FIGS. 1A-1F are block diagrams of various data structures in accordance with one embodiment of the present invention.
Figure 1B:
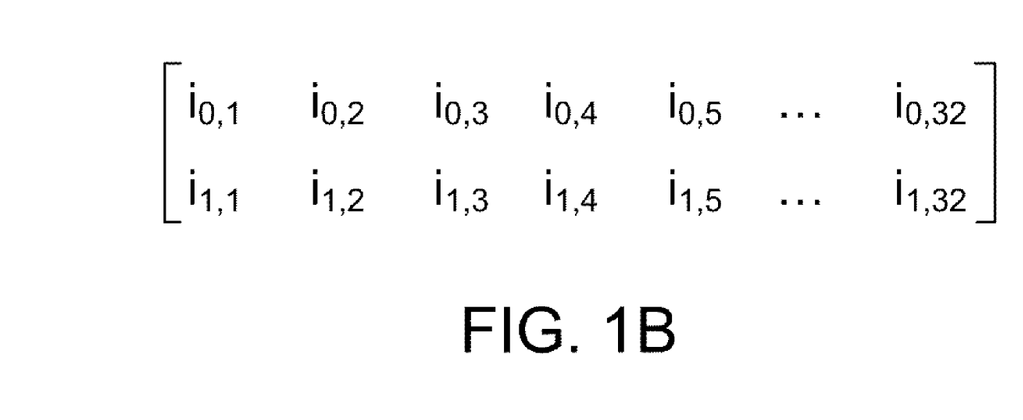
Figure 1C:
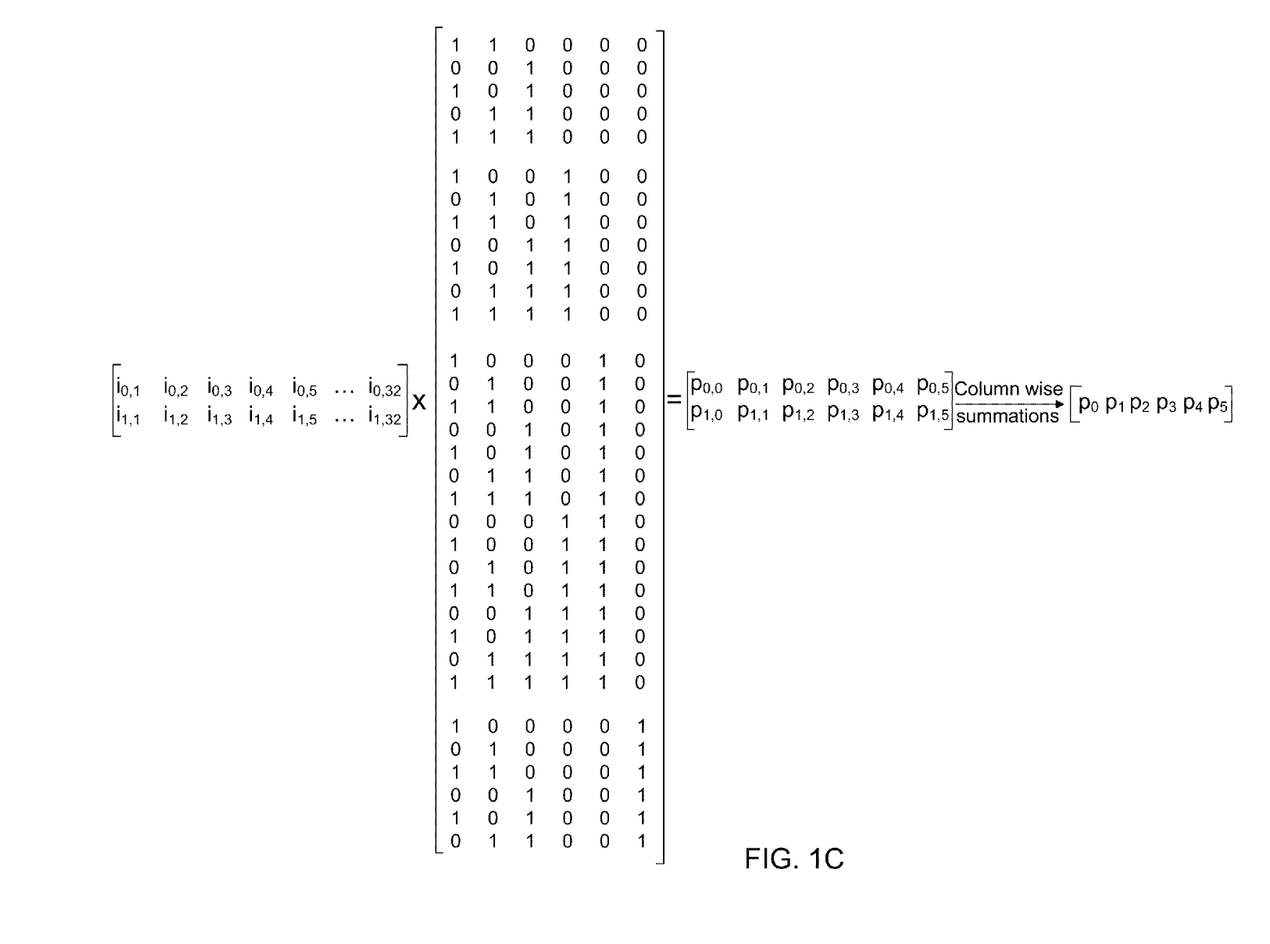

An exemplary RAH code in accordance with one embodiment of the present invention is a (72,64) code, with 64 information bits and 8 code bits. The 8 code bits of this code can be generated through two separate steps. First, two code bits may be generated that are the residue of the 64 information bits in modulo 3, represented as $(r_1 r_0)$. Note while this example uses modulo 3, other implementations may use a different factor. These bits can be generated using a residue generator. Second, the last 6 bits $(p_5 p_4 p_3 p_2 p_1 p_0)$ may be generated using a Hamming matrix. The resulting code may thus be in the form of the 72-bit code word shown in FIG. 1A. For generating the parity bits of the code, the 64 information bits can be arranged into a 2×32 matrix, called an information matrix, an example of which is shown in FIG. 1B. The first row ($i_{0,1}$ to $i_{0,32}$) represents the first to thirty-second bits of the information word, and the second row ($i_{1,1}$ to $i_{1,32}$) represents the thirty-third to sixty-fourth bits of the information word. Multiplying a 2×32 information matrix with a 32×6 Hamming matrix generates a 2×6 parity matrix. Then performing a column-wise summation on the 2×6 matrix generates 6 parity bits, namely $p_5 p_4 p_3 p_2 p_1 p_0$, as seen in FIG. 1C. Note that the order and location of the coding bits can vary in different embodiments.

The decoding process may be performed by generating 6 syndrome bits of the code using the Hamming matrix. The parity syndrome generation is similar to the encoding process. Assume there are $i_1 \ldots i_{64}$ information bits, which were encoded into a 72-bit codeword: $i_1 \ldots i_{64} r_0 r_1 p_0 p_1 p_2 p_3 p_4 p_5$ with 64 information bits ($i_1 \ldots i_{64}$), two residual bits ($r_0 r_1$) and six parity bits ($p_0 \ldots p_5$). Then at the decoder a 72-bit codeword is received that may contain errors. This potentially erroneous codeword can be represented as $i'_1 \ldots i'_{64} r'_0 r'_1 p'_0 p'_1 p'_2 p'_3 p'_4 p'_5$. At the decoder, a new set of parity bits may be generated from information bits $i'_1 \ldots i'_{64}$, using the encoding generator matrix. These generated parity bits may be referred to as $p''_0 p''_1 p''_2 p''_3 p''_4 p''_5$. The syndrome parity bits that locate the errors are generated by bit-by-bit exclusive-OR (XOR) operations between $p'_0 p'_1 p'_2 f_3 p'_4 p'_5$ and $p''_0 p''_1 p''_2 p''_3 p''_4 p''_5$, and result in syndrome parity bits, called $sp_0 sp_1 sp_2 sp_3 sp_4 sp_5$.

Figure 1D:
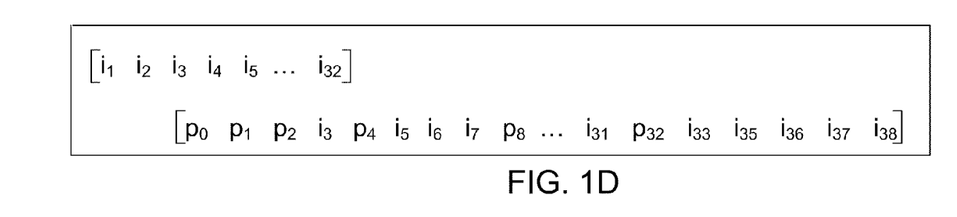

If the value of the syndrome parity bits is zero, it indicates that there is no error in the code. A non-zero value of the syndrome parity bits, however, indicates that there is an error in the codeword. In typical Hamming codes, the non-zero value of the 6-bit syndrome pinpoints the erroneous bit in the code. For example if the non-zero value is 29, it indicates that the 29th bit of the codeword has error. Of course this requires a special arrangement of the information bits. In one embodiment, a hybrid code may be arranged as a (38, 32, 3) Hamming code. This arrangement has 6 empty entries assigned to the entries with index of power of 2, i.e., entries with indexes 1, 2, 4, 8, 16, and 32. The other entries are simply shifted to the left and therefore the representation of the information bits reaches index 38, as shown in FIG. 1D. Thus to use the value of the parity syndrome to locate the error bit among the information bits, the information bits can be re-arranged. FIG. 1D shows the new arrangement of the information bits. The only difference of the new arrangement is the insertion of 6 empty entries for insertion of the 6 parity bits by shifting the original entries to the right.

Figure 1E:
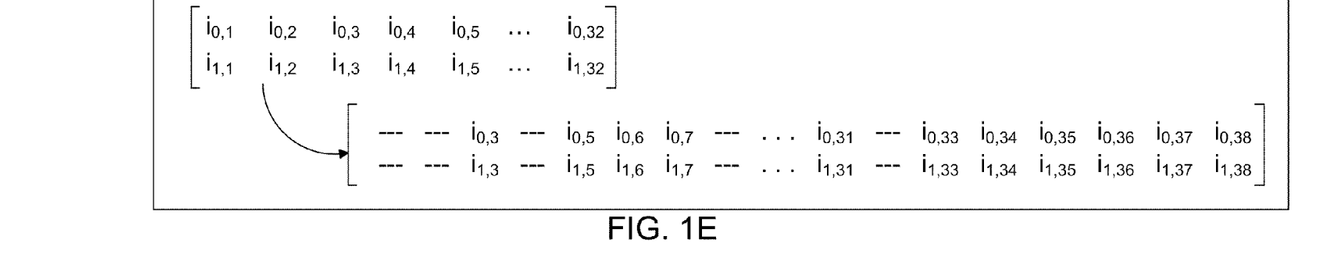

The error is corrected in the code by flipping the erroneous bit. In the RAH code, each row of the matrix has the same rearrangement as the Hamming code rearrangement of FIG. 1D, as shown in FIG. 1E. In the RAH code, the non-zero value of the 6-bit syndrome points to the column containing the erroneous bit in the 2×38 rearranged information matrix. It indicates that one of the two rows of that column contains the error, but cannot identify which one.

Figure 1F:
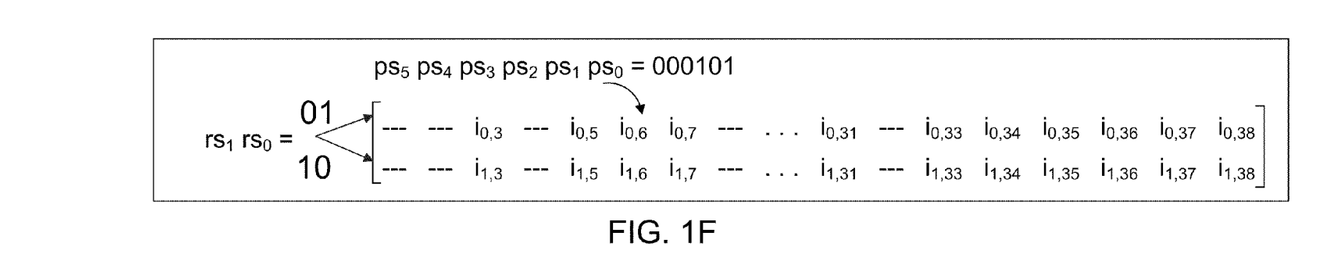

At this point, using the parity syndrome bits, the column of the erroneous bit is identified by the parity syndrome. The row of the erroneous bit is identified by the residual arithmetic part of the code bits. Again assume $i_1 \ldots i_{64} r_0 r_0 p_0 p_1 p_2 p_3 p_4 p_5$ is the original codeword, and $i'_1 \ldots i'_{64} r'_0 r'_1 p'_0 p'_1 p'_2 p'_3 p'_4 p'_5$ is the codeword with a potential error bit. During the correction process, the residue (e.g., modulo 3) of the received information bits $i'_1 \ldots i'_{64}$ may be generated, and called $r''_1 r''_0$. The syndrome of the residual arithmetic part is generated by subtracting the two residues: $[r'_1 r'_0]-[r''_1 r''_0]$, called syndrome residual bits, $sr_1 sr_0$. The syndrome residual bits have 2 possible values: $(01)_2$, and $(10)_2$ (of course, the $(00)_2$ value belongs to the error-free case), as shown in FIG. 1F. Each of these two values corresponds to the rows in the matrix. Of course this is true for uni-directional errors, meaning all the errors are either 1-to-0 or 0-to-1 and not both. As seen in FIG. 1F, the correction process is done by locating the errors. The parity syndrome bits locate the column of the error and the residual arithmetic syndrome locates the row of the error. Namely, where $rs_1 rs_0=01$, the error is in the first row, and where $rs_1 rs_0=10$, the error is in the second row.

The above process can thus pinpoint the errors in the information bits, identifying the row and the column of the error point. To complete the error correction process, an identification of errors in the parity bits and in the residue bits can occur. If there is an error in the information bits, the parity bits in the Hamming code parts point to the column of the error bit and the residue bits point to the row of the error and therefore the erroneous bit will be identified. If both syndrome parity and syndrome residue bits are zero, then the codeword is error free. If only syndrome parity is non-zero and syndrome residue is zero, then the error is in the parity bits themselves (i.e., $p_0 p_1 p_2 p_3 p_4 p_5$), and if the syndrome parity bits are zero and the syndrome residue bits are non-zero, the error bit is in the residue bits (i.e., $r_0 r_1$). In either of these latter cases, the information bits can be used directly without a correction procedure.

In various embodiments, a universal error correction code in accordance with an embodiment of the present invention may be suitable both for memory blocks and datapath blocks. Therefore, data can easily flow between these two blocks without being encoded and decoded each time. This reduces the power consumption and area overhead and improves performance. It also increases the error coverage and provides a clean design, which enables the SOC design methodology.

Figure 2:
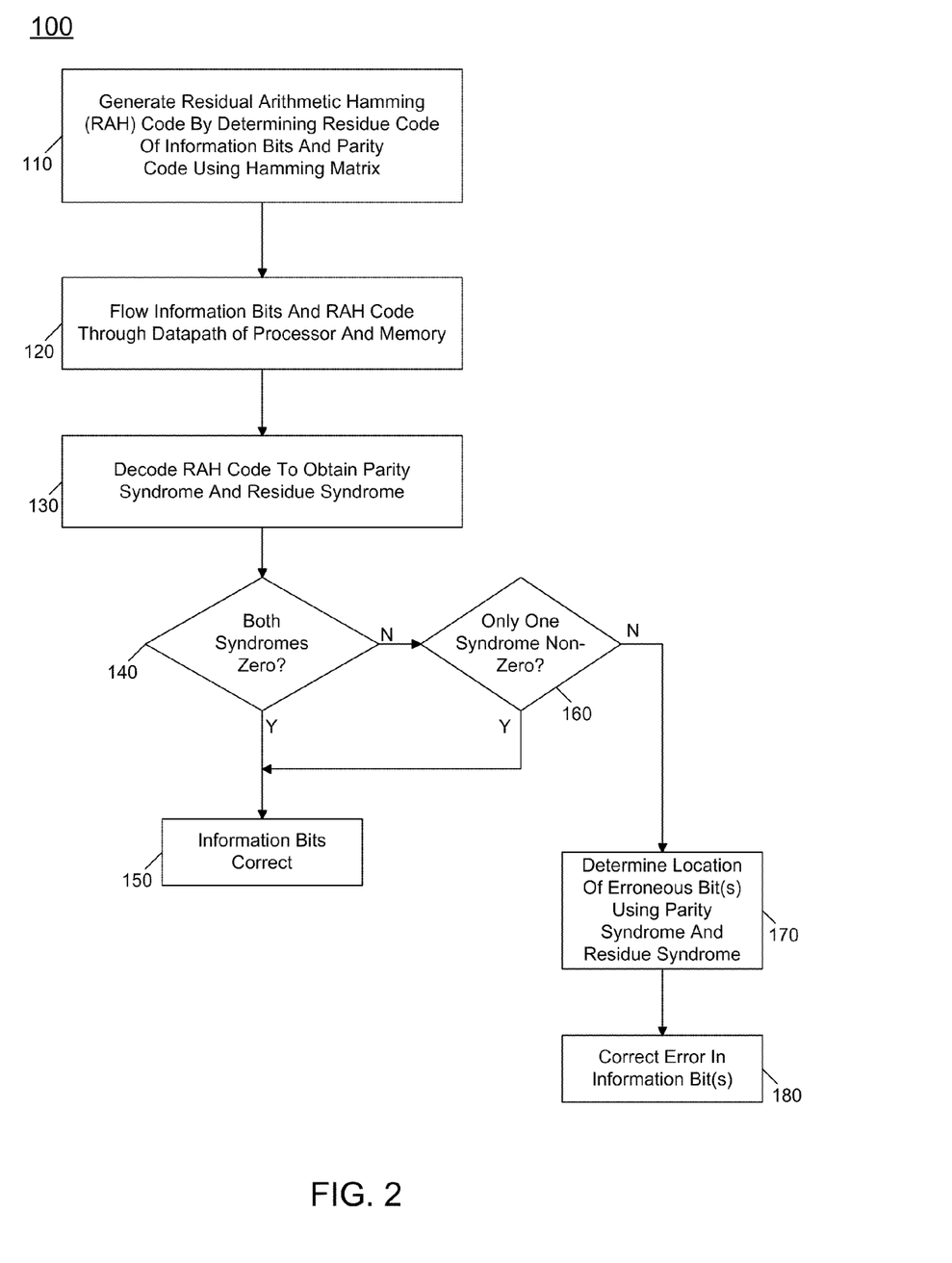
FIG. 2 is a flow diagram of a method in accordance with one embodiment of the present invention.

Referring now to FIG. 2, shown is a flow diagram of a method in accordance with one embodiment of the present invention. As shown in FIG. 2, method 100 may be implemented within various structures of a processor, memory or other component to provide both error detection and correction. Method 100 may begin by generating a RAH code for a plurality of information bits, namely a data block (block 110). While the scope of the present invention is not limited in this regard, the data block may be 64 bits, although many different data widths are possible. As discussed above, such code may be generated by determining both a residue code and a parity code. The residue code may be, in one embodiment, a 2-bit code generated from a given amount of information, e.g., 64 information bits. In turn, the parity code may be a 6-bit parity code generated from the information bits and using a Hamming matrix. Note that this RAH code may thus be generated concurrently and within a single code generation unit, rather than separate error detection and correction codings depending on a given structure at which the data is located. Once this RAH code is generated, it may flow through a processor datapath and various memory subsystem components with the information bits (block 120). That is, using an embodiment of the present invention a codeword can be sent from a first sub-block or structure to a second sub-block or structure without the need for a further decoding and encoding at a boundary of these units.

When a particular processor or other structure seeks to use the data and is capable of performing a decoding of the code, at block 130 the RAH code is decoded to obtain a parity syndrome and a residue syndrome, as described above. Note that a first step in such decoding may be to format the data in an appropriate matrix such as the 2×32 matrix of FIG. 1F. It may next be determined whether both of these syndromes are zero (diamond 140). If so, this is an indication that the information bits are correct (block 150). Accordingly, the given structure may directly use the information bits.

If instead at diamond 140 it is determined that both syndromes are not zero, this indicates that an error may be present in the information bits. Accordingly, control passes to diamond 160, where it may be determined whether only one of the syndromes is non-zero. If so, this indicates that the error is present in the indicated syndrome, and as such the information is correct and can be directly used. If both syndromes are non-zero, control passes to block 170, where a location of the error may be determined using both the parity syndrome and the residue syndrome. Once the location has been determined at block 170, the error may be corrected, e.g., in an error correction logic, which may be part of a decoder or a separate entity (block 180). In one embodiment, this error may be corrected by changing the state of the bit at the indicated location, e.g., in a matrix, as determined using the parity and residual syndromes as described above. While shown with this particular implementation in the embodiment of FIG. 2, the scope of the present invention is not limited in this regard.

Figure 3:
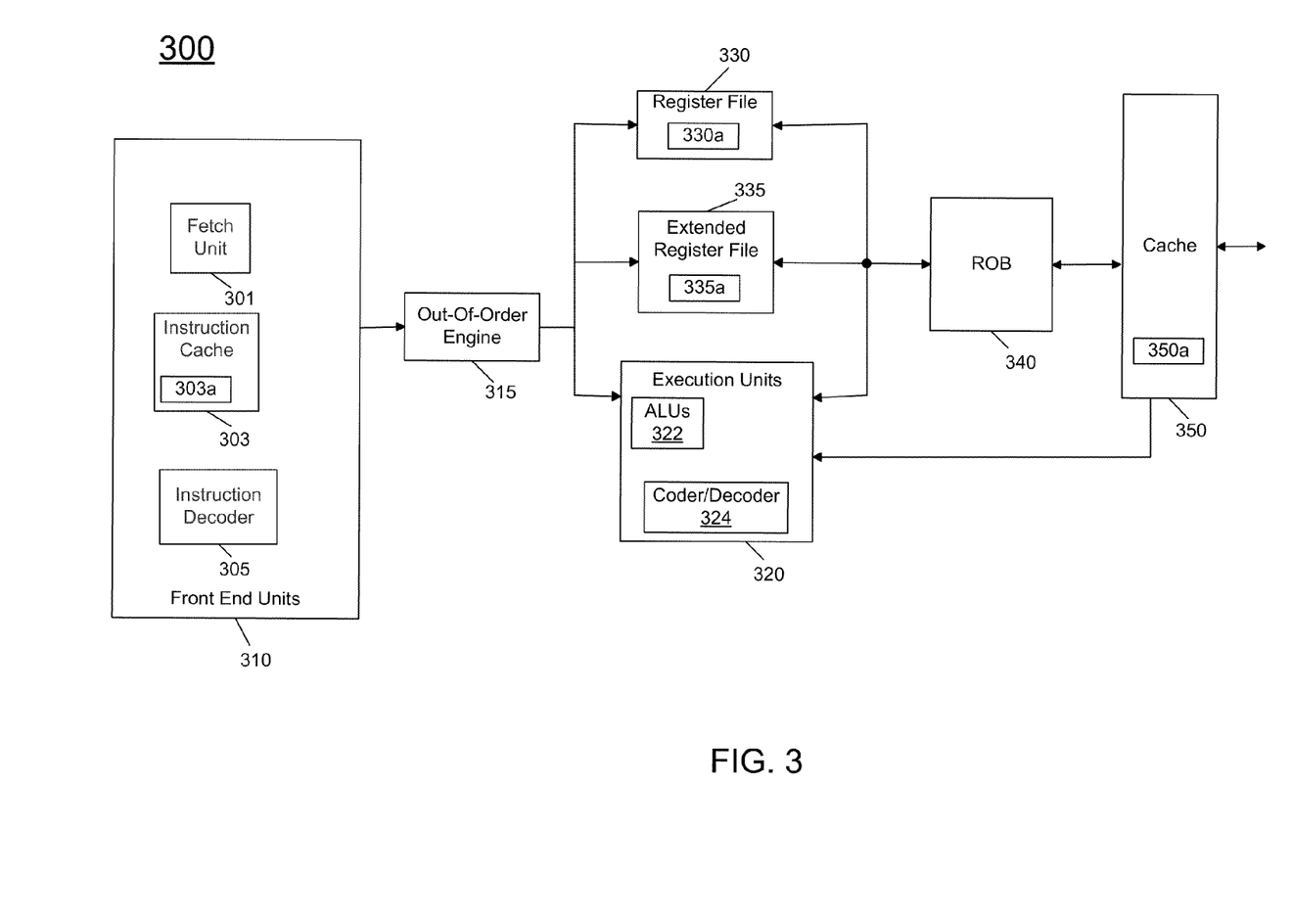
FIG. 3 is a block diagram of a processor core in accordance with one embodiment of the present invention.

Embodiments can be implemented in many different systems. For example, embodiments can be realized in a processor such as a multicore processor. Referring now to FIG. 3, shown is a block diagram of a processor core in accordance with one embodiment of the present invention. As shown in FIG. 3, processor core 300 may be a multi-stage pipelined out-of-order processor. Processor core 300 is shown with a relatively simplified view in FIG. 3 to illustrate various features used in connection with universal or hybrid ECC codes in accordance with an embodiment of the present invention.

As shown in FIG. 3, core 300 includes front end units 310, which may be used to fetch instructions to be executed and prepare them for use later in the processor. For example, front end units 310 may include a fetch unit 301, an instruction cache 303, and an instruction decoder 305. In some implementations, front end units 310 may further include a trace cache, along with microcode storage as well as a micro-operation storage. Fetch unit 301 may fetch macro-instructions, e.g., from memory or instruction cache 303, and feed them to instruction decoder 305 to decode them into primitives, i.e., micro-operations for execution by the processor. In various embodiments, one or more of the front end storages may be protected using a universal ECC in accordance with one embodiment of the present invention. In the specific embodiment shown in FIG. 3, instruction cache 303 may implement such coding/decoding using a logic 303a in accordance with an embodiment of the present invention. Note that various structures throughout core 300 may include similar logic to handle ECC codes in accordance with an embodiment of the present invention as data moves through the pipeline.

Coupled between front end units 310 and execution units 320 is an out-of-order (OOO) engine 315 that may be used to receive the micro-instructions and prepare them for execution. More specifically OOO engine 315 may include various buffers to re-order micro-instruction flow and allocate various resources needed for execution, as well as to provide renaming of logical registers onto storage locations within various register files such as register file 330 and extended register file 335. Register file 330 may include separate register files for integer and floating point operations. Extended register file 335 may provide storage for vector-sized units, e.g., 256 or 512 bits per register. Note that as data (e.g., information bits) are passed through the various units of the processor, the coding bits of the RAH code may pass with the information bits. Note that register files may similarly be associated with ECC logics 330a and 335a.

Various resources may be present in execution units 320, including, for example, various integer, floating point, and single instruction multiple data (SIMD) logic units, among other specialized hardware. For example, such execution units may include one or more arithmetic logic units (ALUs) 322. In some implementations a coder/decoder (generically, a coder) 324 in accordance with an embodiment of the present invention, which may be used to generate a hybrid ECC code such as a RAH code, can be present in execution units 320. This code may include a residue generator/checker and a Hamming generator/checker. While shown at this particular location in the embodiment of FIG. 3, this coder may be present at different places in a processor. Still further, multiple such units may be provided, both within and external to a processor. Results may be provided to retirement logic, namely a reorder buffer (ROB) 340. More specifically, ROB 340 may include various arrays and logic to receive information associated with instructions that are executed. This information is then examined by ROB 340 to determine whether the instructions can be validly retired and result data committed to the architectural state of the processor, or whether one or more exceptions occurred that prevent a proper retirement of the instructions. Of course, ROB 340 may handle other operations associated with retirement.

As shown in FIG. 3, ROB 340 is coupled to a cache 350 which, in one embodiment may be a low level cache (e.g., an L1 cache) and which may also include logic 350a to perform hybrid ECC coding, although the scope of the present invention is not limited in this regard. Also, execution units 320 can be directly coupled to cache 350. From cache 350, data communication may occur with higher level caches, system memory and so forth. While shown with this high level in the embodiment of FIG. 3, understand the scope of the present invention is not limited in this regard.

Figure 4:
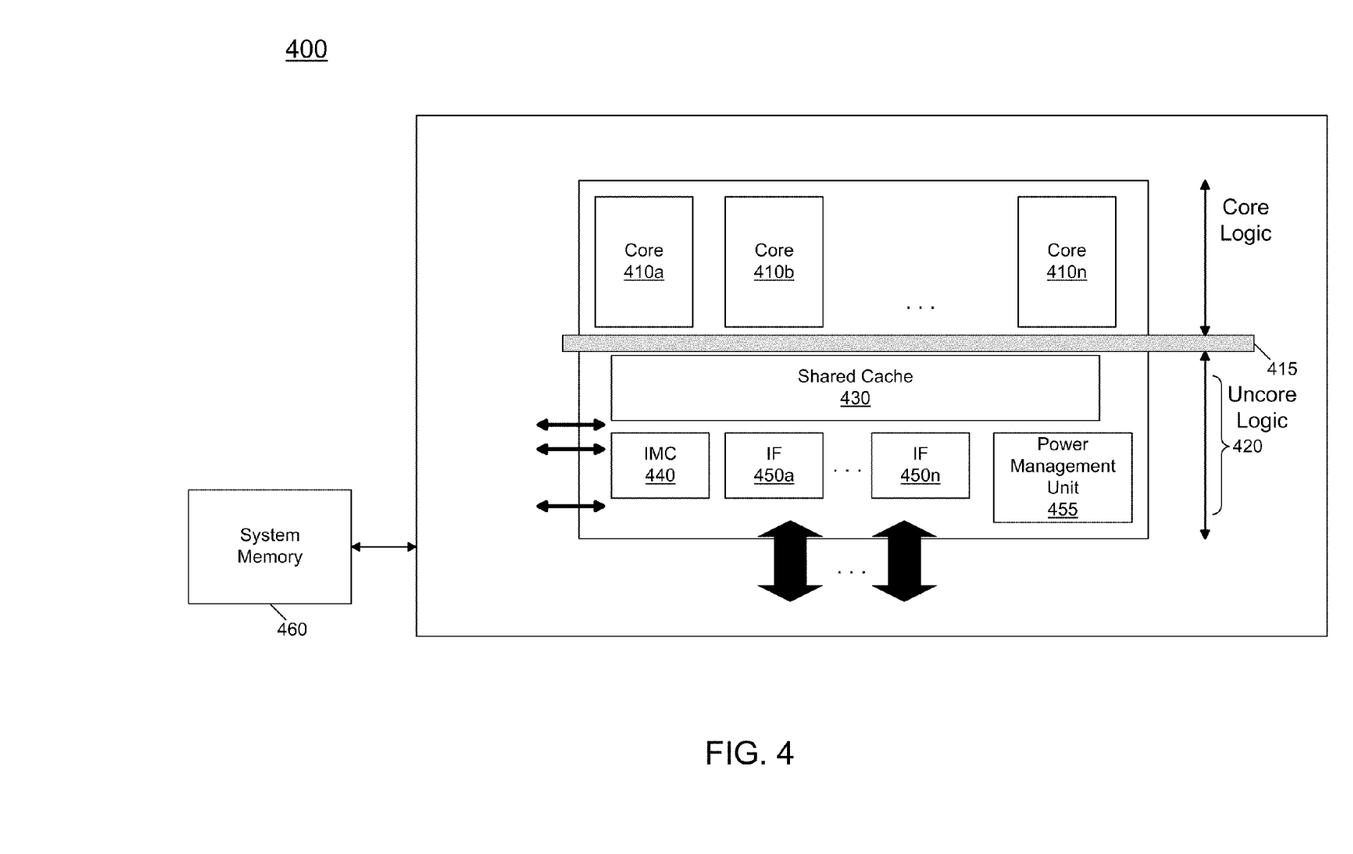
FIG. 4 is a block diagram of a processor in accordance with an embodiment of the present invention.

Referring now to FIG. 4, shown is a block diagram of a processor in accordance with an embodiment of the present invention. As shown in FIG. 4, processor 400 may be a multicore processor including a plurality of cores $410_a$-$410_n$. In one embodiment, each such core may be configured as core 300 described above with regard to FIG. 3. The various cores may be coupled via an interconnect 415 to an uncore 420 that includes various components. As seen, the uncore 420 may include a shared cache 430 which may be a last level cache. In addition, the uncore may include an integrated memory controller 440, various interfaces 450 and a power management unit 455. Various structures, both within cores 410 and uncore 420, along with the shared cache 430 may be protected using a hybrid ECC in accordance with an embodiment of the present invention. To that end, such structures may include coders/decoders, as described above. As seen, processor 400 may communicate with a system memory 460, e.g., via a memory bus. In addition, by interfaces 450, connection can be made to various off-chip components such as peripheral devices, mass storage and so forth. While shown with this particular implementation in the embodiment of FIG. 4, the scope of the present invention is not limited in this regard. In this implementation the coders/decoders may not only be used in the core and uncore, but also used to cover the communication between the cores and between cores and uncores, and any other interconnects in the system.

Figure 5:
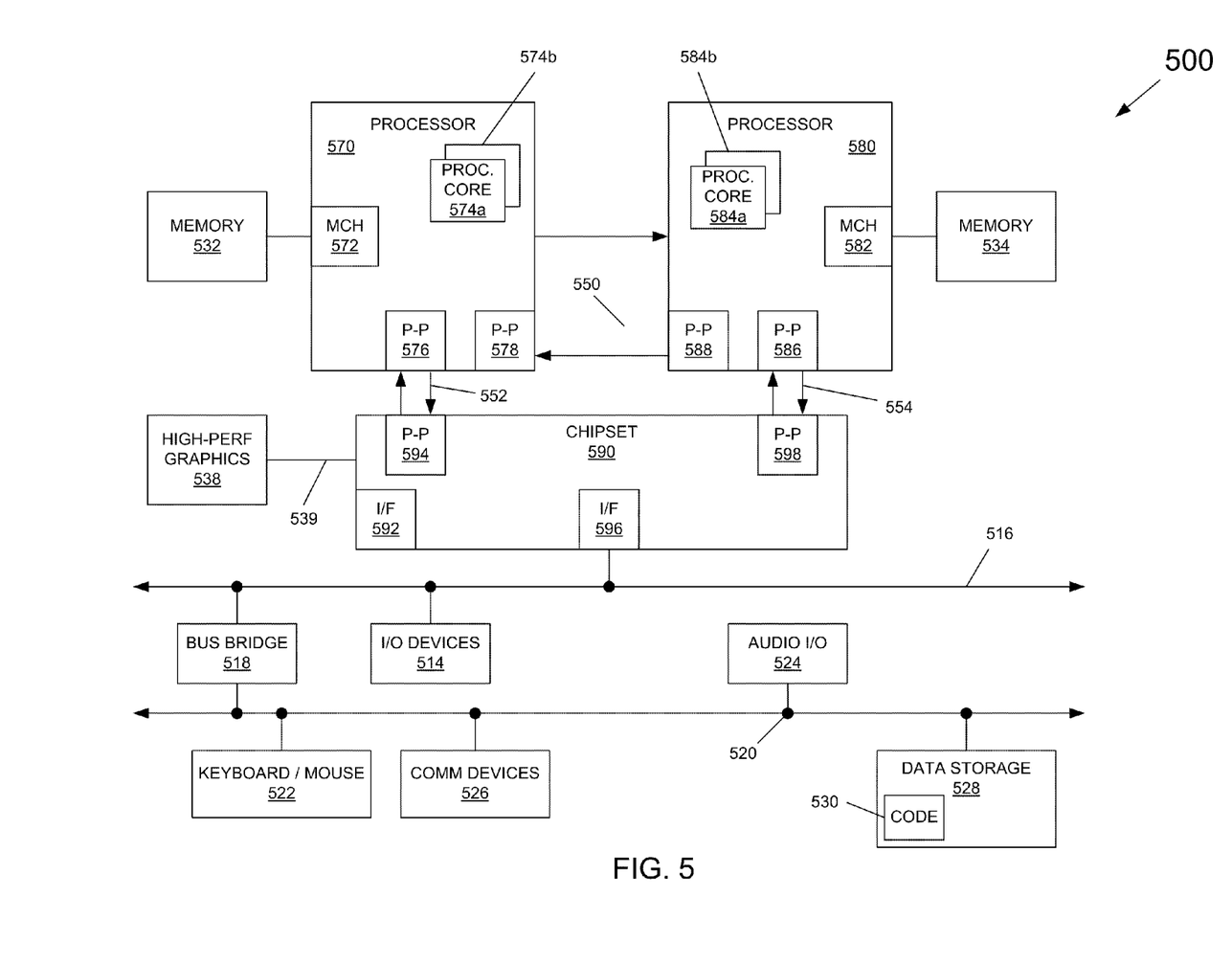
FIG. 5 is a block diagram of a system in accordance with an embodiment of the present invention.

Embodiments may be implemented in many different system types. Referring now to FIG. 5, shown is a block diagram of a system in accordance with an embodiment of the present invention. As shown in FIG. 5, multiprocessor system 500 is a point-to-point interconnect system, and includes a first processor 570 and a second processor 580 coupled via a point-to-point interconnect 550. As shown in FIG. 5, each of processors 570 and 580 may be multicore processors, including first and second processor cores (i.e., processor cores 574a and 574b and processor cores 584a and 584b), although potentially many more cores may be present in the processors. Virtually all of the components of system 500, including the processor cores, storages, link interfaces, bus interfaces, and so forth may include various structures that can be protected using a hybrid ECC in accordance with an embodiment of the present invention. Thus as data travels throughout system 500, it can be protected by a hybrid ECC and can be handled by the different components of the system.

Still referring to FIG. 5, first processor 570 further includes a memory controller hub (MCH) 572 and point-to-point (P-P) interfaces 576 and 578. Similarly, second processor 580 includes a MCH 582 and P-P interfaces 586 and 588. As shown in FIG. 5, MCH's 572 and 582 couple the processors to respective memories, namely a memory 532 and a memory 534, which may be portions of main memory (e.g., a dynamic random access memory (DRAM)) locally attached to the respective processors. First processor 570 and second processor 580 may be coupled to a chipset 590 via P-P interconnects 552 and 554, respectively. As shown in FIG. 5, chipset 590 includes P-P interfaces 594 and 598.

Furthermore, chipset 590 includes an interface 592 to couple chipset 590 with a high performance graphics engine 538, by a P-P interconnect 539. In turn, chipset 590 may be coupled to a first bus 516 via an interface 596. As shown in FIG. 5, various input/output (I/O) devices 514 may be coupled to first bus 516, along with a bus bridge 518 which couples first bus 516 to a second bus 520. Various devices may be coupled to second bus 520 including, for example, a keyboard/mouse 522, communication devices 526 and a data storage unit 528 such as a disk drive or other mass storage device which may include code 530, in one embodiment. Further, an audio I/O 524 may be coupled to second bus 520.

Embodiments may be implemented in code and may be stored on a storage medium having stored thereon instructions which can be used to program a system to perform the instructions. The storage medium may include, but is not limited to, any type of disk including floppy disks, optical disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    generating a hybrid error correction code for a data block, including generating a first residue code based on the data block and generating a first parity code based on the data block and a Hamming matrix; and
    communicating the data block and the hybrid error correction code through at least a portion of a datapath of a processor.

2. The method of claim 1, wherein the hybrid error correction code comprises a residual arithmetic-Hamming (RAH) code.

3. The method of claim 2, further comprising decoding the RAH code to obtain a parity syndrome and a residue syndrome.

4. The method of claim 3, wherein decoding the RAH code further includes receiving the data block and the RAH code in a decoder and generating a second residue code based on the data block and a second parity code based on the data block and the Hamming matrix.

5. The method of claim 4, further comprising calculating the parity syndrome from the first and second parity codes and calculating the residue syndrome from the first and second residue codes.

6. The method of claim 5, wherein calculating the parity syndrome comprises performing a bitwise comparison between the first and second residue codes and calculating the residue syndrome comprises determining a difference between the first and second residue codes.

7. The method of claim 5, further comprising determining a location of an error in the data block using the parity syndrome and the residue syndrome, if both of the parity syndrome and the residue syndrome are non-zero, and correcting the error at the determined location.

8. The method of claim 1, further comprising communicating the data block and the hybrid error correction code from a first block of the processor that implements error correction coding to a second block of the processor that implements error detection coding.

9. An apparatus comprising:
    a code generator to generate a hybrid error correction code for a data block, the hybrid error correction code including a first residue code based on the data block and a first parity code based on the data block and a Hamming matrix, wherein the code generator is to output a codeword including the data block and the hybrid error correction code; and
    a datapath coupled to the code generator to communicate the codeword to a first structure.

10. The apparatus of claim 9, wherein the hybrid error correction code comprises a residual arithmetic-Hamming (RAH) code.

11. The apparatus of claim 10, wherein the first structure is coupled to the datapath and includes a decoder to decode the RAH code to obtain a parity syndrome and a residue syndrome.

12. The apparatus of claim 11, wherein the decoder is to generate a second residue code based on the data block and a second parity code based on the data block and the Hamming matrix.

13. The apparatus of claim 12, wherein the decoder is to calculate the parity syndrome from the first and second parity codes and to calculate the residue syndrome from the first and second residue codes.

14. The apparatus of claim 13, wherein the decoder is to determine a location of an error in the data block using the parity syndrome and the residue syndrome, if both of the parity syndrome and the residue syndrome are of a non-zero value.

15. The apparatus of claim 14, further comprising error correction logic coupled to the decoder to correct the error at the determined location.

16. The apparatus of claim 9, wherein the first structure is to decode the codeword to perform error detection using the first residue code.

17. The apparatus of claim 16, wherein the first structure is to communicate the codeword to a second structure coupled to the first structure, wherein the second structure is to perform error correction using the first residue code and the first parity code.

18. A system comprising:
    a processor including a front end unit having first logic to generate a hybrid error correction code for a data block, the hybrid error correction code including a first residue code based on the data block and a first parity code based on the data block and a Hamming matrix, wherein the first logic is to output a codeword including the data block and the hybrid error correction code, and at least one execution unit coupled to the front end unit to receive the codeword and to perform an operation on the data block; and
    a dynamic random access memory (DRAM) coupled to the processor.

19. The system of claim 18, wherein the processor further includes a cache memory coupled to the at least one execution unit and including a decoder to receive a second codeword including a second data block and a second hybrid error correction code and to perform error detection and error correction on the second data block based on the second hybrid error correction code.

20. The system of claim 18, wherein the processor further includes a first structure to decode the codeword to perform error detection using the first residue code and to communicate the codeword to a second structure coupled to the first structure, wherein the second structure is to perform error correction using the first residue code and the first parity code.

* * * * *